United States Patent [19]

Beha et al.

[11] Patent Number: 4,703,260
[45] Date of Patent: Oct. 27, 1987

[54] FULL CHIP INTEGRATED CIRCUIT TESTER

[75] Inventors: Johannes G. Beha, Wadenswil, Switzerland; Russell W. Dreyfus, Mt. Kisco, N.Y.; Jeffrey A. Kash, Pleasantville, N.Y.; Gary W. Rubloff, Katonah, N.Y.

[73] Assignee: International Business Machines Corporation, Armonk, N.Y.

[21] Appl. No.: 778,823

[22] Filed: Sep. 23, 1985

[51] Int. Cl.⁴ .................................. G01R 31/28
[52] U.S. Cl. .................. 324/158 R; 324/73 R
[58] Field of Search ............ 324/158 D, 158 R, 73 R, 324/73 PC, 96; 356/237, 425, 426, 237

[56] References Cited

U.S. PATENT DOCUMENTS 4,588,950  5/1986  Henley ........................... 324/158 R Primary Examiner—Ernest F. Karlsen
Attorney, Agent, or Firm—Carl C. Kling

[57] ABSTRACT

Contactless probing of an integrating circuit is carried out by flooding the surface of the integrated circuit with pulsed ultraviolet laser light, causing photoelectron emission as a function of the potentials at micropoints on the integrated circuit, converting this two-dimensional electron pattern into a corresponding relatively long duration pattern of luminescence by a luminescent target, and reviewing the result by video/computer scanning. Separate embodiments allow testing either in vacuum or in air, with or without insulating passivation layers present on the chip. The result is a contactless oscilloscope which monitors instantaneous voltage (logic states and AC switching waveforms) for a full two-dimensional array of micropoints simultaneously. A chip with test points and appropriate windows for laser activation and luminescent targeting can be specially designed for optimal testing.

11 Claims, 4 Drawing Figures

FULL CHIP INTEGRATED CIRCUIT TESTER

BACKGROUND OF THE INVENTION

1. Field of the Invention

This invention relates to noncontact dynamic operational monitoring testing of integrated circuits, and more particularly relates to a full chip testing procedure by which instantaneous operational voltages at a number of nodes on an integrated circuit are interrogated by pulsed laser induced photoemission at specific times during the chip clock cycle, for result interpretation through voltage discriminated luminescence.

2. Description of the Prior Art

Known techniques for testing internal nodes of integrated circuits, whether carried out by mechanical contact probing or contactless techniques, suffer from the inherently slow speed of any point-by-point measurement. In addition, most of these do not give as reliable a picture of the circuit operation as would a real-time measurement.

The following are representative of the prior art and scientific background:

Copending U.S. patent application of Beha, Dreyfus and Rubloff, Ser. No. 667,506 filed Nov. 1, 1984, entitled NON-CONTACT DYNAMIC TESTER FOR INTEGRATED CIRCUITS, shows a tester which allows testing in vacuum of the dynamic operation and performance of high-speed very large scale integration (VLSI) circuits, including on-chip contactless measurement of AC switching waveforms (picosecond time scales) as well as logic state evaluation (nanosecond time scales) using high energy photons (about 5-6 eV). This technique is based on the phenomenon of photon-induced electron emission (photoelectron emission) from a solid surface into vacuum. In this technique, the voltage of a single circuit node is measured as a function of time during the chip clock cycle.

Copending U.S. patent application of Beha, Dreyfus, Hartstein and Rubloff, Ser. No. 717,409, filed Mar. 29, 1985, now U.S. Pat. No. 4,644,264, entitled PHOTON ASSISTED TUNNELING TESTING FOR PASSIVATED INTEGRATED CIRCUITS, shows a tester which allows testing in air of the dynamic operation and performance of high-speed very large scale integration (VLSI) circuits. This technique employs a transparent insulating passivation layer, often present over the circuit's internal nodes, together with a metal overlayer on top of the insulating layer in order to detect the monitoring signal, based on the phenomenon of photon-assisted tunneling from a metal into an oxide. The voltage of a single circuit node is measured as a function of time during the chip clock cycle.

Copending U.S. patent application of Beha, Dreyfus and Rubloff, Ser. No. 717,407, filed Mar. 29, 1985, now U.S. Pat. No. 4,670,710, entitled NONCONTACT FULL-LINE DYNAMIC AC TESTER FOR INTEGRATED CIRCUITS, shows a tester which allows testing in vacuum of the dynamic operation and performance of high-speed very large scale integration (VLSI) circuits. By producing a line focus with the incident laser light and employing high-speed electron deflection optics for the photoemitted electrons (as exploited in a streak camera), this technique achieves simultaneous measurement of the voltage of a one-dimensional array of internal nodes on a circuit.

These real-time measurements of internal node voltages on a chip fall short of the high testing speed attainable by simultaneous measurement of a two-dimensional array of circuit nodes, which is the object of the present invention.

U.S. Pat. No. 1,957,249, Dantscher, ELECTRON DISCHARGE APPARATUS, May 1, 1934, merely shows electron discharge from electron beam excitation. Electron beam testing methods are known as means for contactless measurement of internal circuit nodes. However, they carry several important limitations. First, they require surface availability of metal conductor test points and are therefore inadequate for testing of passivated circuits. Second, the electron beam causes damage to passivating layer materials such as oxides and must therefore be carefully directed away from such areas. Third, and most crucial, they do not permit simultaneous measurement of an array of circuit nodes.

In our copending patent applications listed above, we described techniques for testing of the dynamic operation and performance of high-speed VLSI circuits. Besides the measurement of AC switching waveforms (picosecond time scales) as part of the verification of hardware design, it is also important and helpful to be able to check that the logic operation of the chip is functionally correct. The ability to test the logic states and AC switching waveforms at internal nodes on the chip becomes increasingly important with high chip complexity and wafer scale integration. This can be accomplished with the laser test methods of our copending U.S. patent applications (Ser. Nos. 667,506, 717,409, and 717,407) with scanning, or with available metal test points at the chip surface, with electron beam methods of by scanning the probe over the chip. Such scanning is time-consuming, making on-line product testing inconvenient, and does not provide a simultaneous test of the circuits on the chip.

The prior art does not teach nor suggest the invention, which permits dynamic real-time testing of a large two-dimensional array of internal circuit node voltages, i.e. "full-chip" testing of logic states and AC switching waveforms, to provide rapid and accurate evaluation of circuit operation.

SUMMARY OF THE INVENTION

The object of the invention is to provide sensitive real-time contactless testing of integrated circuits. Specific embodiments permit such testing in air environment as well as in vacuum environment, and also allow testing with or without insulating passivation layers present above the circuit nodes to be tested.

Another object of the invention is to extend such testing of integrated circuits to carry out "full-chip" real-time testing of AC switching waveforms and logic states, i.e. simultaneous testing of a two-dimensional array of internal circuit nodes.

A specific object of the invention is to permit such testing with oxide, insulator, or passivation layers present on top of the metal test points, thus bringing the test environment into operational similarity with eventual use environment.

Another specific object of the invention is to permit such testing in air environment, as well as in vacuum.

A feature of the invention is the biasing of the chip-to-test to provide increased discrimination by providing a threshold for laser-induced photoemission.

Another feature of the invention is the use of parallel optical processing of the two-dimensional array of information representing the voltage states of test points on the chip. The retained image is then evaluated by computer to provide the necessary test results in computer-usable form.

A specific feature of two embodiments of the invention is the use of electron optics systems with microchannel plates and phosphor screen, to image a two-dimensional electron beam pattern and convert it into a corresponding two-dimensional optical pattern.

Another specific feature of an embodiment of the invention is the use of fluorescent material in the passivating insulator layer on the chip to convert the two-dimensional electron signal pattern into a corresponding optical signal pattern.

Another specific feature of two embodiments of the invention is the use of a thin metal overlayer on top of a transparent passivating insulating layer on the chip, such that electrons in the test signal can pass through this thin metal overlayer into vacuum for imaging and measurement.

Another feature of an embodiment of the invention is a chip with available test points passivated, equipped with luminescent screen and positioned in windows for easy testing.

An advantage of the invention is that the entire chip may be read simultaneously, during a single pulse of the chip clock, to provide an instantaneous readout of voltage state of all the test points from which test data might be required.

Another advantage of the invention is that though all test readings are taken at the high speeds necessary for laser induced photoemission and for reading the voltage state of a high performance integrated circuit, readings are retained for evaluation by the computer. Multiple laser scans may thus be carried out in a very short time, followed by a relatively leisurely review of the test results to determine necessary action, such as reject, rework, accept.

Another advantage of the invention is that it achieves high time resolution (5 picosecond or less) and lateral resolution (1 micron or less) and high voltage resolution (of order 1 mV in reasonable measurement times).

The manufacturing advantage of truly full-chip non-destructive testing, with passivation layers present, which allows testing in the same tool used to carry out personalization, significantly extends the economic advantages of in-process testing by providing freer choice of test time and easier test setup.

The foregoing and other objcts, features and advantages of the invention will be apparent from the more particular description of the preferred embodiments of the invention, as illustrated in the accompanying drawings.

DESCRIPTION OF PREFERRED EMBODIMENTS OF THE INVENTION

Figure 1:
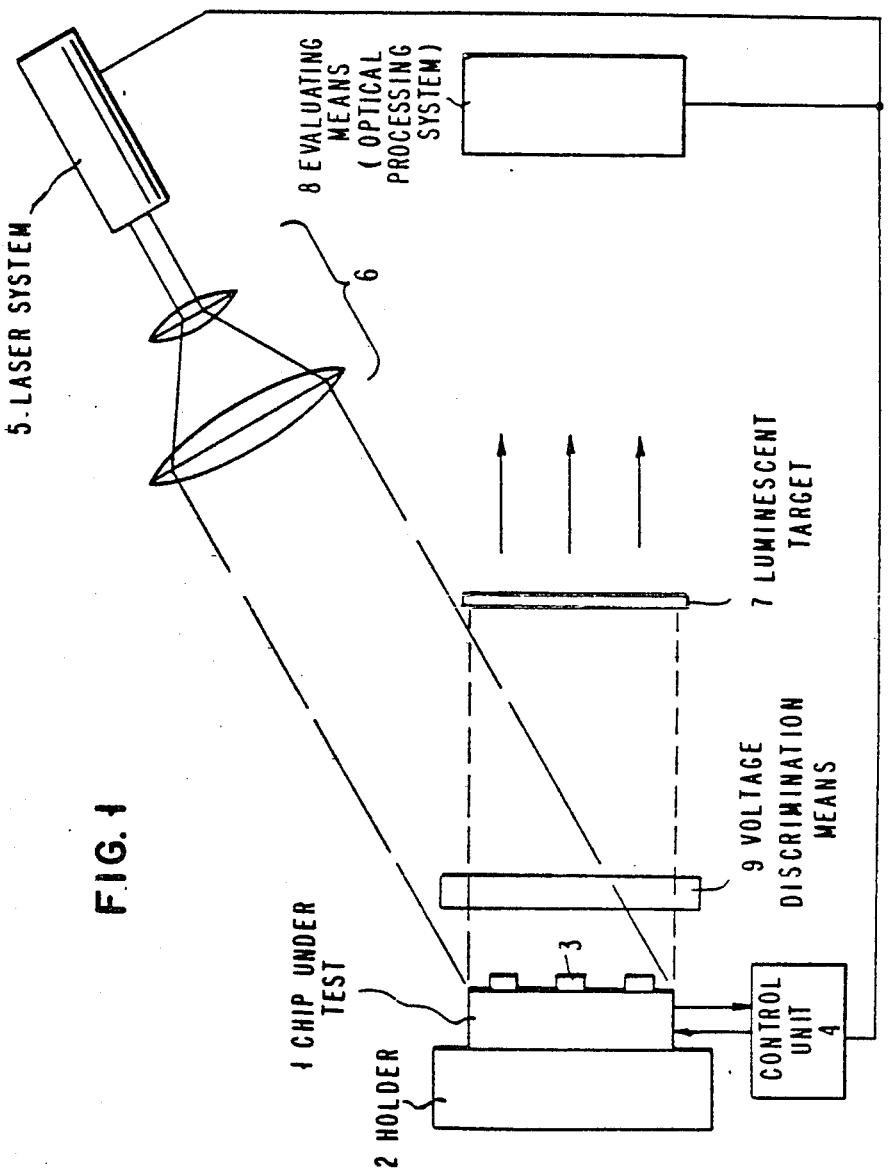
FIG. 1 is a schematic diagram of the invention.

FIG. 1 is a schematic diagram of the invention, showing the impinging pulsed laser beam, the chip under test, and the two-dimensional optical array processor according to the inventive technique.

This technique is a method and apparatus to measure logic states and AC switching waveforms simultaneously in a two-dimensional array across an entire chip, thereby reducing testing time drastically. All voltage levels on the chip are determined at the same time and during the same cycle of the chip clock. This ability to do full-chip testing represents a considerable advance.

The common and salient elements of the full-chip testing method are depicted schematically in FIG. 1. The chip under test 1 is mounted on a substrate or holder 2 so that its various internal nodes or test points 3 are accessible for testing. For high levels of chip integration (typically 10,000-100,000 transistors or circuits per chip) many internal nodes are present which may be the subject of the testing. The operation of the circuitry on the chip is accomplished by driver circuitry in control unit 4, so that the chip runs during the test at full speed as designed.

At a particular instant of time a very fast laser pulse is delivered from the laser system 5 with sufficient photon energy to induce photoelectron emission from the test points 3 on the chip. The laser light is expanded by optical system 6 to illuminate the entire chip, causing photoemission signals from all points which are indicative of the voltages to be determined at that instant of time. Laser system 5 and optical system 6 may be characterized as "activation means." The amount of the photoelectron signal emanating from each test point on the chip is indicative of its voltage during the laser pulse.

The photoelectron patterns are modified and processed by a luminescent target 7, evaluation means 8 and voltage discrimination means 9 to represent test point voltages. These patterns then carry the two-dimensional voltage information, which is translated into a corresponding two-dimensional optical emission pattern from a luminescent (phosphorescent or fluorescent screen) target 7. The pattern is then measured by a parallel optical processing system 8, such as is employed in a vidicon system. Although the response time of the phosphor and video system is not particularly fast, the information corresponds only to the voltage pattern which was present at test points on the chip during the fast laser pulse. With laser pulse widths of 5 picosends or less, time resolution of the full-chip testing system remains extremely fast, consistent with both AC waveform and real-time logic state testing of high performance integrated circuits.

The mechanism by which the photoelectron pattern emanating from the chip is translated into a two-dimensional optical emission pattern from luminescent target 7 can vary considerably, accommodating applications in air or in vacuum, and also with or without passivation layers present on top of the chip test points 3. Three specific embodiments are discussed below.

FIRST EMBODIMENT: TESTING IN VACUUM WITHOUT PASSIVATION LAYERS PRESENT

Figure 2:
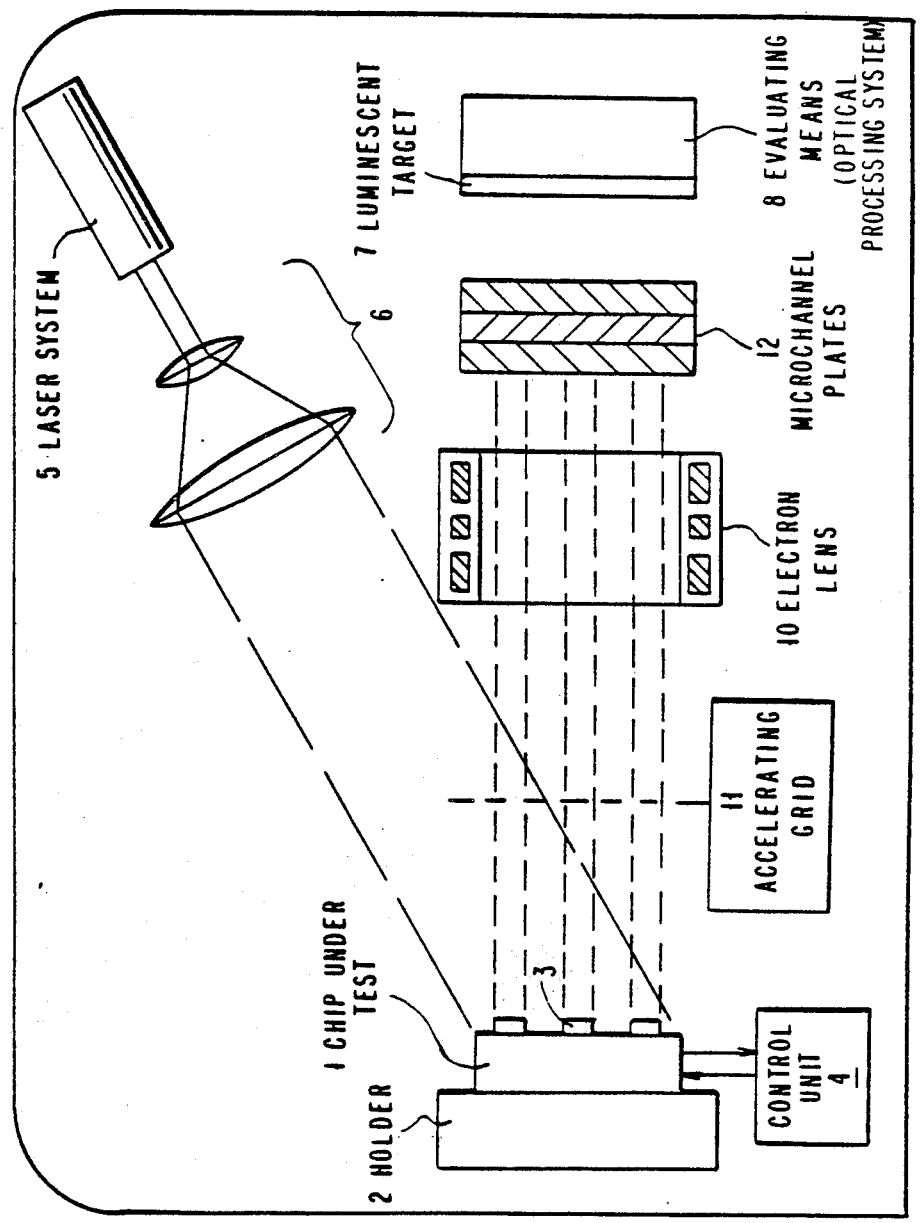
FIG. 2 is a schematic diagram of a first specific embodiment of the invention, directed at testing in vacuum without passivation layers present.

FIG. 2 is a schematic diagram of a first specific embodiment of the invention, directed at testing in vacuum without passivation layers present. An ultraviolet laser beam from laser 5 via optics 6, pulsed synchronously with the chip clock from control unit 4, impinges over the entire chip 1. With laser photon energies L above the work function W of the metal test points 3 on the chip 1, photoelectrons are generated (primary and secondary). These photoelectrons are then imaged onto one or more microchannel plates 12 by an electron lens 10. An accelerating grid 11 in front of the chip 1 may also be employed to reduce the effects of stray microfields on the chip 1 and to provide voltage discrimination in the signal pattern. The microchannel plates 12 are a high density array of electron multiplier plates which produce high gain in the electron intensity (up to 1,000,000×). These larger electron currents are then accelerated to a luminescent (phosphor) target 7 in optical processing system 8, producing a luminescent representation of test voltages on the chip 1. The image brightness at a given test point is a direct function of the voltage at that test point 3 on the chip 1. This luminescent image is then processed by the optical processing system 8, which may be a vidicon or other video device. The image can be retained in the luminescent (phosphor screen) target 7 for much longer times than the laser pulse width.

Since this scheme measures all points on the chip simultaneously, high power laser pulses are required to achieve sufficient signal. This can be attained with commercially available pulsed ultraviolet excimer lasers. Such lasers now have pulse widths in the range 3–20 ns, which is sufficient to resolve voltage levels within a chip clock cycle. A Lumonics TE-861T-4 excimer laser is an example. The characteristics of such a laser are given in Table I for three of the available gases. Using photoyields as estimated in Table 1, assuming the laser beam to be imaged onto a 10 mm.×10 mm. chip, and reducing the peak power density to an acceptable level (10 mJ/cm$^2$), we find that each 1 micron×1 micron test point could give 35,000–370,000 electrons per laser pulse. This is more than sufficient to make a reasonable voltage measurement for all points on the chip in one laser pulse. Consider the case of KrCl (the worst of the three in Table I) as an example. Assuming the same energy distribution of photoelectrons (1 eV width), a 10 mV change in voltage could be measured with a signal/noise ratio of 2 in a single laser pulse for all 1 micron points on the chip.

TABLE I

Characteristics of some pulsed uv excimer lasers (i.e, Lumonics TE-861T-4) and expected testing photocurrents from Au metal pad/interconnect test points.
Photoyield: calculated from yield above threshold from Au data of W. F. Krolikowski and W. E. Spicer, Phys. Rev. B 1, 478 (1970)

| Laser | | | |
|---|---|---|---|
| Gas | ArF | F2 | KrCl |
| Wavelength (nm) | 193. | 157. | 222. |
| Photon energy (eV) | 6.42 | 7.90 | 5.59 |
| Min pulse width (ns) | 10. | 6. | 6. |
| Max pulse energy (mJ) | 140. | 12. | 25. |
| Max pulse rate (picoseconds) | 200. | 200. | 200. |
| Photon flux during pulse (photons/sec) | 1.3 E + 25 | 1.5 E + 24 | 4.0 E + 24 |
| Estimated photoyield at laser wavelength (electrons/absorbed photon) | 6.0 E − 04 | 3.0 E − 03 | 2.0 E − 04 |
| Electron flux during pulse (electrons/sec) | 8.0 E + 21 | 4.5 E + 21 | 8.8 E + 20 |
| No. electrons per pulse | 8.0 E + 13 | 4.5 E + 13 | 8.8 E + 12 |
| No. electrons/pulse at each test pt (assuming 1 sq. micron ea, 10 mm. × 10 mm. chip and laser beam size) | 8.0 E + 05 | 4.5 E + 05 | 8.8 E + 04 |
| No. electrons/pulse at each test pt for peak power density reduced to 10 mJ/cm2. | 5.7 E + 04 | 3.7 E + 05 | 3.5 E + 04 |

SECOND EMBODIMENT: TESTING IN VACUUM WITH PASSIVATION LAYERS PRESENT

Figure 3:
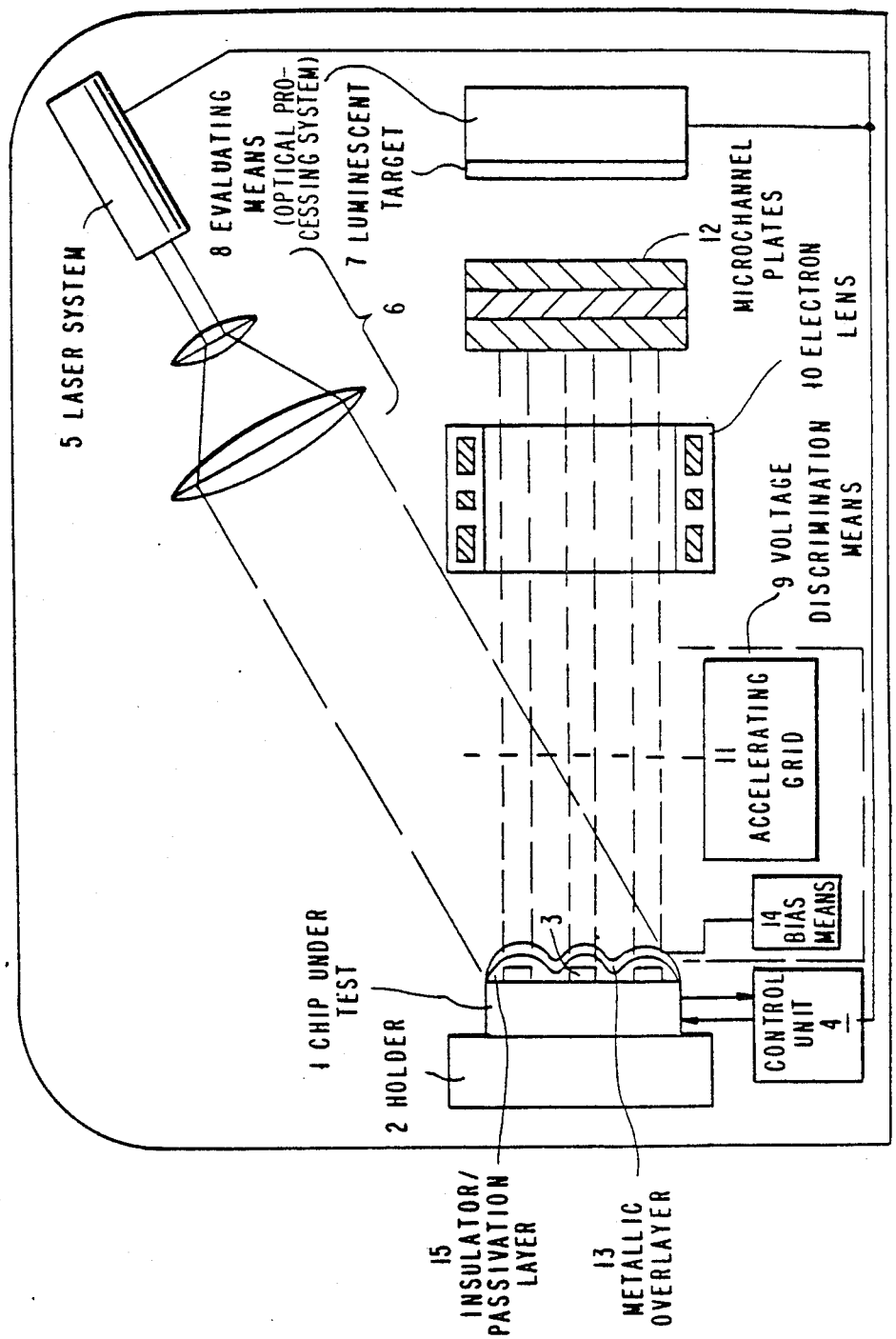
FIG. 3 is a schematic diagram of a second specific embodiment of the invention, directed at testing in vacuum with passivation layers present.

FIG. 3 is a schematic diagram of a second specific embodiment of the invention, directed at testing in vacuum with passivation layers present. The presence of the passivation layers causes three fundamental changes from the first embodiment. First, the threshold energy which the laser light must overcome is reduced by the presence of the passivation layers. Second, the photoelectron energy discrimination is accomplished differently, by the use of photon-assisted tunneling, rather than by electrostatic grids and electron optics in vacuum. Third, electrons having passed the energy analysis stage (photon-assisted tunneling into the insulator or passivation layer) must be emitted into vacuum. This is accomplished by making the metal overlayer very thin.

The apparatus for this second embodiment in FIG. 3 is very similar to that in the first embodiment (FIG. 2) and for common elements is numbered the same. Elements added are metallic overlayer 13, bias means 14 and passivation layer 15 which together with accelerating grid 11 form voltage discriminating means 9 as shown by the dashed bracket and as shown more schematically in FIG. 1. In this case, however, the photon energy from the laser 5 is lower so as to accomplish photon-assisted tunneling of electrons from the metal test points 3 into the conduction band of the insulator/passivation layer 15 present on the chip 1. It is also a condition, easily achieved, that the passivation layer 15 be transparent to the laser light.

The photoelectrons are collected at a very thin (few hundred angstroms or less) metallic overlayer 13 which is deposited onto the passivation layer, such that laser light can also pass through this metal overlayer. With a voltage applied to the metal overlayer 13 by voltage supply 14, proper electrostatic fields are generated across the passivation layer. A fraction of the electrons reaching the metal overlayer 13 will pass through the metal into the vacuum, since the metal overlayer 13 is thin. These electrons are then accelerated and imagd onto microchannel plates 12 as before (if increased gain is necessary) and thence onto the luminescent target 7 to produce a two-dimensional optical image which can be processed to attain the desired test information. In this embodiment, the function of the electron optics is acceleration and reimaging, but not voltage discrimination as in the first embodiment.

THIRD EMBODIMENT: TESTING IN AIR WITH PASSIVATION LAYERS PRESENT

Figure 4:
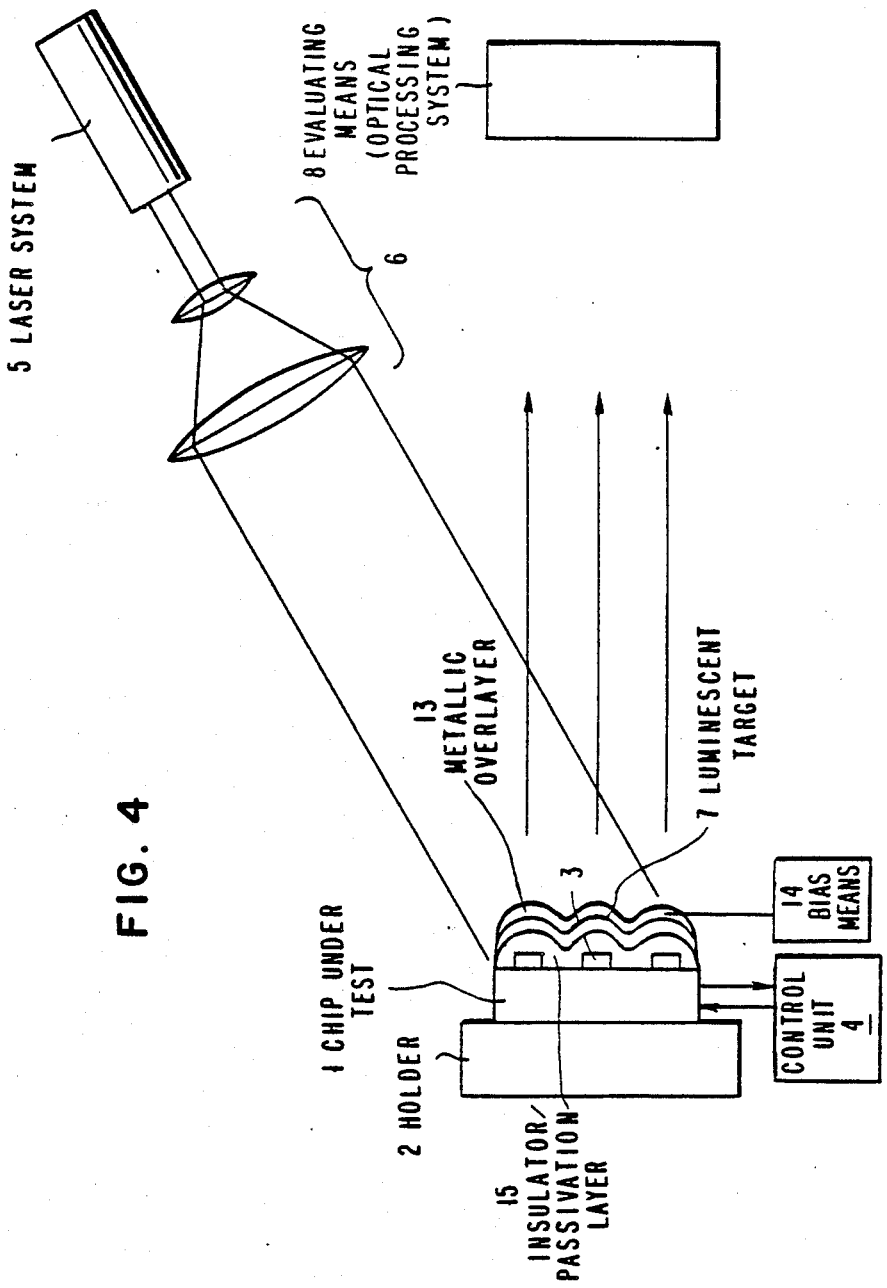
FIG. 4 is a schematic diagram of a third specific embodiment of the invention, directed at testing in air with passivation layers present.

FIG. 4 is a schematic diagram of a third specific embodiment of the invention, directed at testing in air with passivation layers present. As in the second embodiment, the voltage discimination is accomplished by photon-assisted tunneling from the chip test points 3 into the conduction band of the insulator/passivation layer 15. However, in this case the photoelectron signal is converted to an optical signal by interaction of the electrons with a luminescent target layer 7 between the insulator 15 and the metal overlayer 13 in windows on the chip 1; this luminescent target layer 7 contains electroluminescent or phosphorescent material. Voltage contrast between different points allows the photoelectron-excited luminescence of luminescent target 7 to be differentiated from the uniform luminescence likely to be excited by the impinging laser pulse itself. In this embodiment, no further processing is required other than the reading of the two-dimensional luminescence pattern of luminescent target 7 with a vidicon-type processing system 8. The entire test can be accomplished in air ambient. Note that the luminescent means (7) can be placed directly over the passivation layer (15) as shown in FIG. 4, or may be placed outboard of electron lens (10), microchannel plates (12), and voltage discrimination means (9), as well as other items as shown in FIG. 3. Direct placement or remote placement of the luminescent means (7) with respect to chip (1) are each acceptable, depending upon the embodiment, so long as the photoemissed electron path is available. That is, the chip (1) and luminescent means (7) must be " . . . in operatively associated relationship."

Thus, while the invention has been described with reference to three preferred embodiments and other variations, it will be understood by those skilled in the art that the foregoing and other changes in form and details may be made without departing from the scope of the invention.

What is claimed is:

1. A system for contactless probing of an integrated circuit chip (1) having test points (3) of interest for testing, characterized by:
   (a) contact means (4) for introducing dynamic operational signals to the chip (1), so as to cause instantaneous operational voltages at selected test points (3) as a function of operation;
   (b) activation means (5-6) for flooding the chip surface with pulsed ultraviolet laser light, causing photoelectron emission as a function of the voltages at test points (3) on the chip (1);
   (c) luminescent target means (7), for converting to luminescence values the photoelectron emission from test points (3); and
   (d) voltage discrimination means (9) associated with the electron path between the chip (1) and said luminescent target means (7), for modifying photoelectron patterns to represent test point voltages.

2. A system for contactless probing of an integrated circuit chip (1) having test points (3) of interest for testing, characterized by:
   (a) control means (4) for introducing dynamic operational signals to the chip (1), so as to cause instantaneous operational voltages at selected test points (3) as a function of operation;
   (b) activation means (5-6) for flooding the chip surface with pulsed ultraviolet laser light, causing photoelectron emission as a function of the voltages at test points (3) on the chip (1);
   (c) luminescent target means (7), for converting to luminescence values the photoelectron emission from test points (3);
   (d) voltage discrimination means (9) located between chip (1) and said luminescent target (7) for modifying photoelectron patterns to represent test point voltages; and
   (e) target evaluating means (8) for viewing said luminescent target means (7) and for processing luminescent values at selected test points (3) to develop test values as a function of luminescent values.

3. A system for contactless probing of an integrated circuit chip (1) having test points (3) of interest for testing, characterized by:
   (a) control means (4) for introducing dynamic operational signals to the chip (1), so as to cause instantaneous operational voltages at selected test points (3) as a function of operation;
   (b) activation means (5-6) for flooding the chip surface with pulsed ultraviolet laser light, causing photoelectron emission as a function of the voltages at test points (3) on the wafer (1);
   (c) luminescent target means (7), for converting to luminescence values the photoelectron emission from test points (3);
   (d) voltage discrimination means (9) located between chip (1) and said luminescent target (7) for modifying photoelectron patterns to represent test point voltages, said voltage discrimination means (9) comprising accelerating grid means (11) and electron optics (10) located between the chip (1) and said luminescent target means (7);
   (e) target evaluating means (8) for viewing said luminescent target means (7) and for processing luminescent values at selected test points (3) to develop test values as a function of luminescent values; and
   (f) vacuum means enclosing at least the chip (1) and said luminescent target means (7);
whereby laser stimulated phtoelectron emissions are differentiated over a threshold for detection.

4. A system for contactless probing of an integrated circuit chip according to claim 2, in which said voltage discrimination means (9) comprises a thin metallic overlayer (13), a passivation layer (15) and bias means (14), whereby photoelectron energy discrimination is accomplished by photon-assisted tunneling through said passivation layer (15) and said metallic overlayer (13), a fraction of emitted photoelectrons passing out of said metallic overlayer (13) into a vacuum to be focussed by electron optics means (10), and to activate said luminescent target means (7) for processing by optical processing systems (8).

5. A system for contactless probing of an integrated circuit chip (1) having test points (3) of interest for testing, characterized by:
   (a) control means (4) for introducing dynamic operational signals to the chip (1), so as to cause instantaneous operational voltages at selected test points (3) as a function of operation;
   (b) activation means (5-6) for flooding the chip surface with pulsed ultraviolet laser light, causing photoelectron emission as a function of the voltages at test points (3) on the chip (1);
   (c) luminescent target means (7), for converting to luminescence values the photoelectron emission from test points (3);
   (d) voltage discrimination means (9) located between chip (1) and said luminescent target means (7) for modifying photoelectron patterns to represent test point voltages;

(e) target evaluating means (8) for viewing said luminescent target means (7) and for processing luminescent values at selected test points (3) to develop test values as a function of luminescent values; and (f) microchannel plates (12) positioned between said voltage discriminated means (9) and said target evaluating means (8).

6. A system for contactless probing of an integrated circuit chip, characterized by:

(a) control means (4) for introducing dynamic operational signals to the chip (1), so as to cause instantaneous operational voltages at selected test points (3) as a function of operation;

(b) activation means (5–6) for flooding the chip surface with pulsed ultraviolet laser light, causing photoelectron emission as a function of the voltages at test points (3) on the chip (1);

(c) luminescent target means (7), for converting to luminescence values the photoelectron emission from test points (3);

(d) voltage discrimination means (9) located between chip (1) and said luminescent target means (7) for modifying photoelectron patterns to represent test point voltages, said voltage discriminating means (9) comprising accelerating grid means (11) and electron optics means (10) located between the chip (1) and said luminescent target means (7);

(e) target evaluating means (8) for viewing said luminescent target means (7) and for processing luminescent values at selected test points (3) to develop test values as a function of luminescent values;

(f) vacuum means enclosing at least the chip (1) and said luminescent target means (7); and (g) microchannel plates (12) positioned between said accelerating grid means (11) and said target evaluating means (8) to intensify the signals photoelectron emissions;

whereby laser stimulated photoemissions are differentiated over a threshold for detection.

7. A testing method for dynamic testing of an integrated circuit chip-to-test (1) before passivation, said chip-to-test (1) having a number of operational circuits and input/output connections, a plurality of test points (3) connected to the operational circuits, characterized by:

(a) placing the chip-to-test (1) in a vacuum environment in a mounting (2) having electrical connections complementary to the input/output connections of the chip-to-test (1), and supporting the chip-to-test (1) for accessibility by laser (5) photons to the test points (3);

(b) connecting input/output exercise means (4) to the chip-to-test (1), so as to exercise the circuits on the chip-to-test (1) in a predetermined pattern, to cause electronic activity in the chip-to-test (1) appropriate to the desired test, so as to provide at selected test points (3) a voltage potential related to operation, whereby the test points (3) accessed by the laser (5) photons provides differing values of electron currents as a function of operation voltage differences;

(c) connecting input/output exercise means (4) to said laser so as to excite photoemission from selected test points (3), which photoemission occurs as electron currents at values related to the instantaneous voltage at the accessed test point (3);

(d) placing luminescent target means (7) in operatively associated relationship with the chip-to-test (1), so as to convert to luminescence of significant duration the photoemission which is a composite function of laser light excitation and of the voltage of the test points, and (e) evaluating the luminescence to provide test data related to chip-to-test (1) operational values.

8. A testing method for dynamic testing of an integrated circuit chip-to-test (1) after passivation, said chip-to-test (1) having a number of operational circuits and input/output connections, a plurality of test points (3) connected to the operational circuits, characterized by:

(a) placing the chip-to-test (1) in a vacuum environment in a mounting (2) having electrical connections complementary to the input/output connections of the chip-to-test (1), and supporting the chip-to-test (1) for accessibility by laser (5) photons to the test points (3);

(b) connecting input/output exercise means (4) to the chip-to-test (1), so as to exercise the circuits on the chip-to-test (1) in a predetermined pattern, to cause electronic activity in the chip-to-test (1) appropriate to the desired test, so as to provide at selected test points (3) a voltage potential related to operation, whereby the test points (3) accessed by the laser (5) photons provides via photon assisted tunneling through the passivation layer (15) to the conductive overlayer (13) differing values of electron currents as a function of operation voltage differences;

(c) connecting input/output exercise means (4) to said laser so as to excite photoemission from selected test points (3), which photoemission occurs as electron currents at values related to the instantaneous voltage at the accessed test point (3);

(d) placing luminescent target means (7) in operatively associated relationship with the chip-to-test (1), so as to convert to luminescence of significant duration the photoemission which is a composite function of laser light excitation and of the voltage of the test points, via the passivation layer; and (e) evaluating the luminescence to provide test data related to chip-to-test (1) operational values.

9. A testing method for an integrated circuit chip-to-test (1), characterized by:

(a) equipping each integrated circuit chip-to-test with a number of conductive test points (3), at identifiable locations accessible by photons even though covered with a passivation layer (15), the passivation layer (15) being dimensioned and selected of material which is photon transmissive and susceptible to photon assisted tunneling when activated by laser light;

(b) adding a thin conductive overlayer (13) over the passivation layer (15), said thin conductive overlayer being metallic or otherwise electrically conductive while penetrable by photons;

(c) placing luminescent target means (7) in operatively associated relationship with the thin conductive overlayer (13) of the integrated circuit chip-to-test (1), to luminesce as a composite function of the laser light activation of the test points (3) and the instantaneous voltage at such test points (3);

(d) connecting pulsed laser means, for activating selected test points (3) on the chip-to-test (1) so as to excite luminescence at values related to the instantaneous voltage potential at the accessed test point;

(e) connecting integrated circuit test exercise control means (4) to the chip-to-test (1) to cause electronic activity in the chip-to-test (1) appropriate to the desired test, so as to provide at test points (3) voltage potentials related to operation, whether correct or faulty; and (f) placing target evaluation means (8) in position for viewing the luminescent target and processing luminescence values as a function of control values so as to determine test values for the chip-to-test (1).

10. A testing method for dynamic testing of an integrated circuit chip-to-test (1) before passivation, said chip-to-test (1) having a number of operational circuits and input/output connections, a plurality of test points (3) connected to the operational circuits, characterized by:

(a) placing the chip-to-test (1) in a vacuum environment in a mounting (2) having electrical connections complementary to the input/output connections of the chip-to-test (1), and supporting the chip-to-test (1) for accessibility by laser (5) photons to the test points (3);

(b) connecting input/output exercise means (4) to the chip-to-test (1), so as to exercise the circuits on the chip-to-test (1) in a predetermined pattern, to cause electronic activity in the chip-to-test (1) appropriate to the desired test, so as to provide at selected test points (3) a voltage potential related to operation, whereby the test points (3) accessed by the pulsed laser (5) provides differing values of electron currents as a function of operation voltage differences;

(c) connecting input/output exercise means (4) to said laser so as to excite photoemission from selected test points (3), which photoemission occurs as electron currents at values related to the instantaneous voltage at the accessed test points (3);

(d) placing luminescent target means (7) in operatively associated relationship with the chip-to-test (1), so as to convert to luminescence of significant duration the photoemission which is a composite function of laser light excitation and of the voltage of the test points (15);

(e) evaluating the luminescence to provide test data related to chip-to-test (1) operational values; and (f) connecting bias means (14) adjacent to the integrated circuit chip-to-test (1), thus controlling the threshold for photoemission;

whereby the test points (3) activated by the pulsed laser (5) provides significantly differing readings for proper operation and for faulty operation.

11. A testing method for an integrated circuit chip-to-test (1), characterized by:

(a) equipping each integrated circuit to be placed under test with a number of conductive test points (3), at identifiable locations accessible by photons even though covered with a passivation layer (15), the passivation layer (15) being dimensioned and selected of material which is photon transmissive and susceptible to photon assisted tunneling when activated by laser light;

(b) adding a thin conductive overlayer (13) over the passivation layer (15), said thin conductive overlayer being metallic or otherwise electrically conductive while penetrable by photons;

(c) placing luminescent target means (7) in operatively associated relationship with the thin conductive overlayer (13) of the integrated circuit chip-to-test (1), to luminesce as a composite function of the laser light activation of the test points (3) and the instantaneous voltage at such test points (3);

(d) connecting pulsed laser means, for activating selected test points (3) on the chip-to-test (1) so as to excite luminescence at values related to the instantaneous voltage potential at the accessed test point;

(e) connecting integrated circuit test exercise control means (4) to the chip-to-test (1) to cause electronic activity in the chip-to-test (1) appropriate to the desired test, so as to provide at test points (3) voltage potentials related to operation, whether correct or faulty;

(f) placing target evaluation means (8) in position for viewing the luminescent target and processing luminescence values as a function of control values so as to determine test values for the chip-to-test (1); and (g) connecting bias means (14) to the thin conductive overlayer (13) of the integrated circuit chip-to-test (1), thus controlling the threshold voltage for photon assisted tunneling;

whereby the test points (3) activated by the pulsed laser (5) provide significantly differing readings for proper operation and for faulty operation.

* * * * *